United States Patent

Yamaguchi et al.

(10) Patent No.: US 9,034,152 B2
(45) Date of Patent: May 19, 2015

(54) REACTIVE SPUTTERING APPARATUS

(75) Inventors: Nobuo Yamaguchi, Tama (JP); Kazuaki Matsuo, Inagi (JP); Susumu Akiyama, Tokyo (JP); Satoshi Uchino, Fuchu (JP); Yoshimitsu Shimane, Hachioji (JP)

(73) Assignee: CANON ANELVA CORPORATION, Kawasaki-Shi (JP)

( * ) Notice: Subject to any disclaimer, the term of this patent is extended or adjusted under 35 U.S.C. 154(b) by 0 days.

(21) Appl. No.: 13/310,230

(22) Filed: Dec. 2, 2011

(65) Prior Publication Data

US 2012/0152736 A1 Jun. 21, 2012

(30) Foreign Application Priority Data

Dec. 21, 2010 (JP) ................................. 2010-284944

(51) Int. Cl.
*H01J 37/34* (2006.01)
*C23C 14/00* (2006.01)

(52) U.S. Cl.
CPC .......... *C23C 14/0063* (2013.01); *H01J 37/3411* (2013.01); *C23C 14/0068* (2013.01); *H01J 37/3405* (2013.01); *H01J 37/3447* (2013.01)

(58) Field of Classification Search
CPC ................................................... H01J 37/3411
See application file for complete search history.

(56) References Cited

U.S. PATENT DOCUMENTS

| | | | |
|---|---|---|---|
| 6,083,361 A | 7/2000 | Kobayashi et al. | |
| 6,592,726 B1 * | 7/2003 | Hashimoto et al. | 204/192.38 |
| 8,663,437 B2 | 3/2014 | Yamaguchi et al. | |
| 2002/0065616 A1 * | 5/2002 | Leng | 702/50 |
| 2003/0159925 A1 | 8/2003 | Sako | |
| 2004/0074769 A1 | 4/2004 | Morinaka et al. | |
| 2009/0114529 A1 | 5/2009 | Dekempeneer et al. | |
| 2010/0224482 A1 * | 9/2010 | Yamaguchi et al. | 204/192.15 |
| 2010/0243438 A1 * | 9/2010 | Yamaguchi et al. | 204/298.11 |
| 2010/0252417 A1 * | 10/2010 | Allen et al. | 204/192.12 |
| 2010/0326818 A1 | 12/2010 | Ikemoto et al. | |
| 2014/0054164 A1 | 2/2014 | Yamaguchi et al. | |

FOREIGN PATENT DOCUMENTS

| | | |
|---|---|---|
| JP | 5-247639 A | 9/1993 |
| JP | 10-330932 A | 12/1998 |
| JP | 2004-156137 A | 6/2004 |

(Continued)

OTHER PUBLICATIONS

Office Action issued in Japanese Patent Application No. 2010-284944, dated Apr. 15, 2014 (3 pages).

*Primary Examiner* — Keith Hendricks
*Assistant Examiner* — Timon Wanga
(74) *Attorney, Agent, or Firm* — Fitzpatrick, Cella, Harper & Scinto

(57) ABSTRACT

A reactive sputtering apparatus includes a chamber, a substrate holder provided in the chamber, a target holder which is provided in the chamber and configured to hold a target, a deposition shield plate which is provided in the chamber so as to form a sputtering space between the target holder and the substrate holder, and prevents a sputter particle from adhering to an inner wall of the chamber, a reactive gas introduction pipe configured to introduce a reactive gas into the sputtering space, an inert gas introduction port which introduces an inert gas into a space that falls outside the sputtering space and within the chamber, and a shielding member which prevents a sputter particle from the target mounted on the target holder from adhering to an introduction port of the reactive gas introduction pipe upon sputtering.

5 Claims, 9 Drawing Sheets

(56) References Cited

FOREIGN PATENT DOCUMENTS

| JP | 2009-531544 A | 9/2009 |
| WO | 02/061166 A1 | 8/2002 |
| WO | 2010/061603 A1 | 6/2010 |

* cited by examiner

REACTIVE SPUTTERING APPARATUS

BACKGROUND OF THE INVENTION

1. Field of the Invention

The present invention relates to a reactive sputtering apparatus.

2. Description of the Related Art

A reactive sputtering apparatus adds a reactive gas such as oxygen or nitrogen to a discharge gas such as argon gas used in a normal sputtering apparatus to generate a compound thin film by the reaction of the reactive gas and sputter particles sputtered from a target material.

The reactive sputtering apparatus can easily form various compound thin films simply by adding a reactive gas to a normal sputtering apparatus, and is therefore often used in a process of manufacturing, for example, a semiconductor or an electronic component material these days. Japanese Patent Laid-Open No. 2004-156137, for example, discloses a thin-film forming apparatus which introduces both argon gas from a sputter gas introduction port provided in a vacuum chamber, and oxygen gas from an oxygen gas introduction port provided in the vacuum chamber.

Japanese Patent Laid-Open No. 5-247639 discloses a sputter apparatus that includes a deposition shield plate which defines a sputtering space in a vacuum chamber, and forms, on the surface of a wafer mounted on a wafer stage in the vacuum chamber, a thin film of metal particles sputtered from a sputter target provided in the upper portion of the vacuum chamber. This sputter apparatus includes an argon gas introduction port which introduces argon into the vacuum chamber, a reactive gas introduction port which directly introduces a reactive gas into the space defined by the deposition shield plate, and a manometer capable of measuring the pressure in the vacuum chamber.

In recent years, to generate a high-quality compound thin film with good reproducibility by reactive sputtering so as to meet a demand for an improvement in performance of devices, the conventional apparatus is not suitable for mass production in terms of pressure stabilization.

Hence, the inventor of the present invention closely examined the cause of this fact, and found out the following problem. That is, a deposition shield plate is normally provided in a processing chamber to prevent adhesion of the sputter material to the chamber. When this deposition shield plate is periodically replaced for maintenance, the pressure in the sputtering space defined by the deposition shield plate, the substrate holder, and the target fluctuates due, for example, to a mounting error of the deposition shield plate. This adversely affects the film quality, leading to degradation in yield.

Also, the sputter apparatus disclosed in Japanese Patent Laid-Open No. 5-247639 includes an argon introduction port which introduces argon into the vacuum chamber, and a reactive gas introduction port which directly introduces a reactive gas into the space defined by the deposition shield plate. Unfortunately, when a film adheres to a gas introduction pipe and peels off, it mixes in a substrate, leading to degradation in yield. Furthermore, the sputter apparatus according to Japanese Patent Laid-Open No. 5-247639 has an integrally formed deposition shield plate and gas introduction port, thus making it impossible to replace only the deposition shield plate having a film adhering on it. In other words, to replace the deposition shield plate, it must be replaced together with the gas introduction port. However, the replacement of the gas introduction port is impractical because the replacement process generates an error due to the differences between individual gas introduction ports or an error upon mounting the gas introduction port, and requires a lot of time and effort. On the other hand, if the deposition shield plate having a film adhering on it is continuously used for a long period of time, the film peels off the deposition shield plate, thus generating particles in the chamber.

SUMMARY OF THE INVENTION

In view of this, the present invention provides a reactive sputtering apparatus advantageous in forming a film with good quality.

One of the aspects of the present invention provides a reactive sputtering apparatus comprising: a chamber; a substrate holder provided in the chamber; a target holder which is provided in the chamber and configured to hold a target; a deposition shield plate which is provided in the chamber so as to form a sputtering space between the target holder and the substrate holder, and prevents a sputter particle from adhering to an inner wall of the chamber; a reactive gas introduction pipe configured to introduce a reactive gas into the sputtering space; an inert gas introduction port which introduces an inert gas into a space that falls outside the sputtering space and within the chamber; and a shielding member which prevents a sputter particle from the target mounted on the target holder from adhering to an introduction port of the reactive gas introduction pipe upon sputtering.

Further features of the present invention will become apparent from the following description of exemplary embodiments with reference to the attached drawings.

DESCRIPTION OF THE EMBODIMENTS

Figure 1:
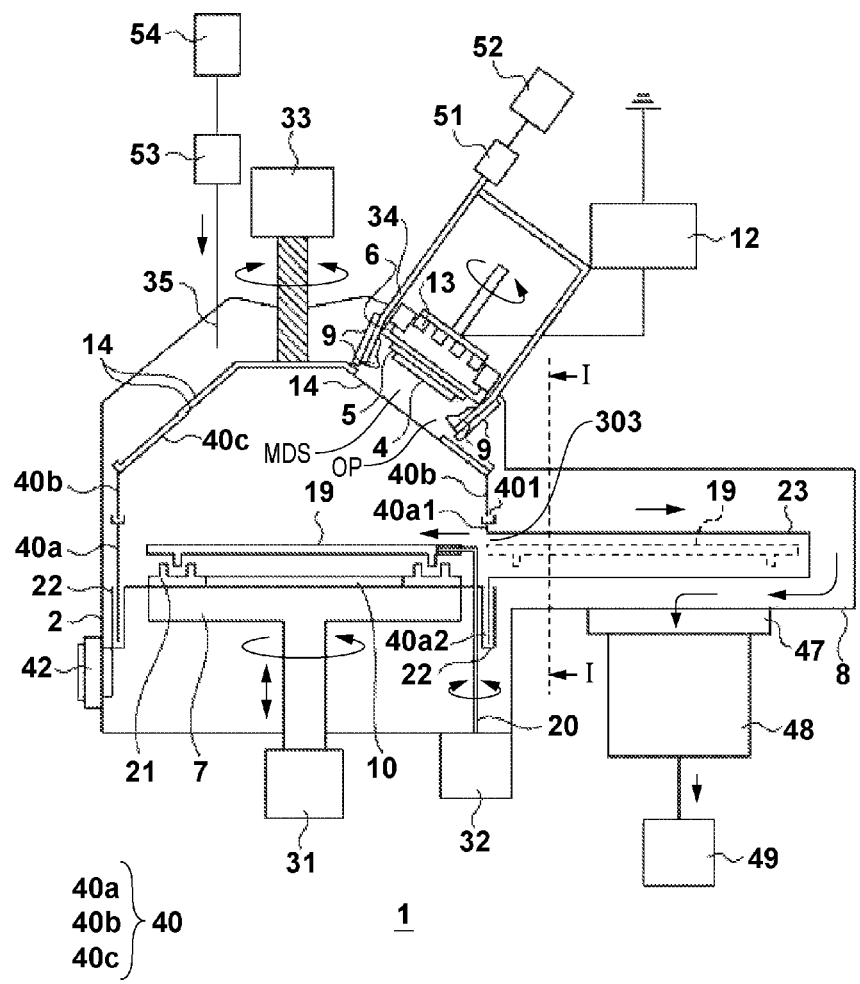
FIG. 1 is a schematic view of a reactive sputtering apparatus in an embodiment according to the present invention.

Exemplary, preferred embodiments of the present invention will be described below with reference to the accompanying drawings. However, constituent elements described in these embodiments merely give examples, so the technical scope of the present invention is determined by the scope of claims and is not limited by the following individual embodiments.

The entire arrangement of a reactive sputtering apparatus in an embodiment according to the present invention will be described with reference to FIG. 1. A reactive sputtering apparatus 1 includes a vacuum chamber 2 which can be evacuated to a vacuum, an exhaust chamber 8 provided to be adjacent to the vacuum chamber 2 via an exhaust port, and an exhaust device which evacuates the vacuum chamber 2 via the exhaust chamber 8. Note that the exhaust device can include a turbo-molecular pump 48. Also, a dry pump 49 can be connected to the turbo-molecular pump 48 of the exhaust device. The exhaust device can be disposed under the exhaust chamber 8. This is advantageous in reducing the area occupied by the entire apparatus as much as possible.

A target holder 6 which holds a target 4 via a back plate 5 can be provided in the vacuum chamber 2. A cathode shutter 14 can be placed near the target holder 6 so as to cover it. The cathode shutter 14 can have the structure of a rotating shutter. The cathode shutter 14 can function as a shielding member for setting a closed state in which the gap between a substrate holder 7 and the target holder 6 is shielded, or an open state in which the gap between the substrate holder 7 and the target holder 6 is open. The opening/closing operation of the cathode shutter 14 can be controlled by a cathode shutter driving mechanism 33.

Figure 7:
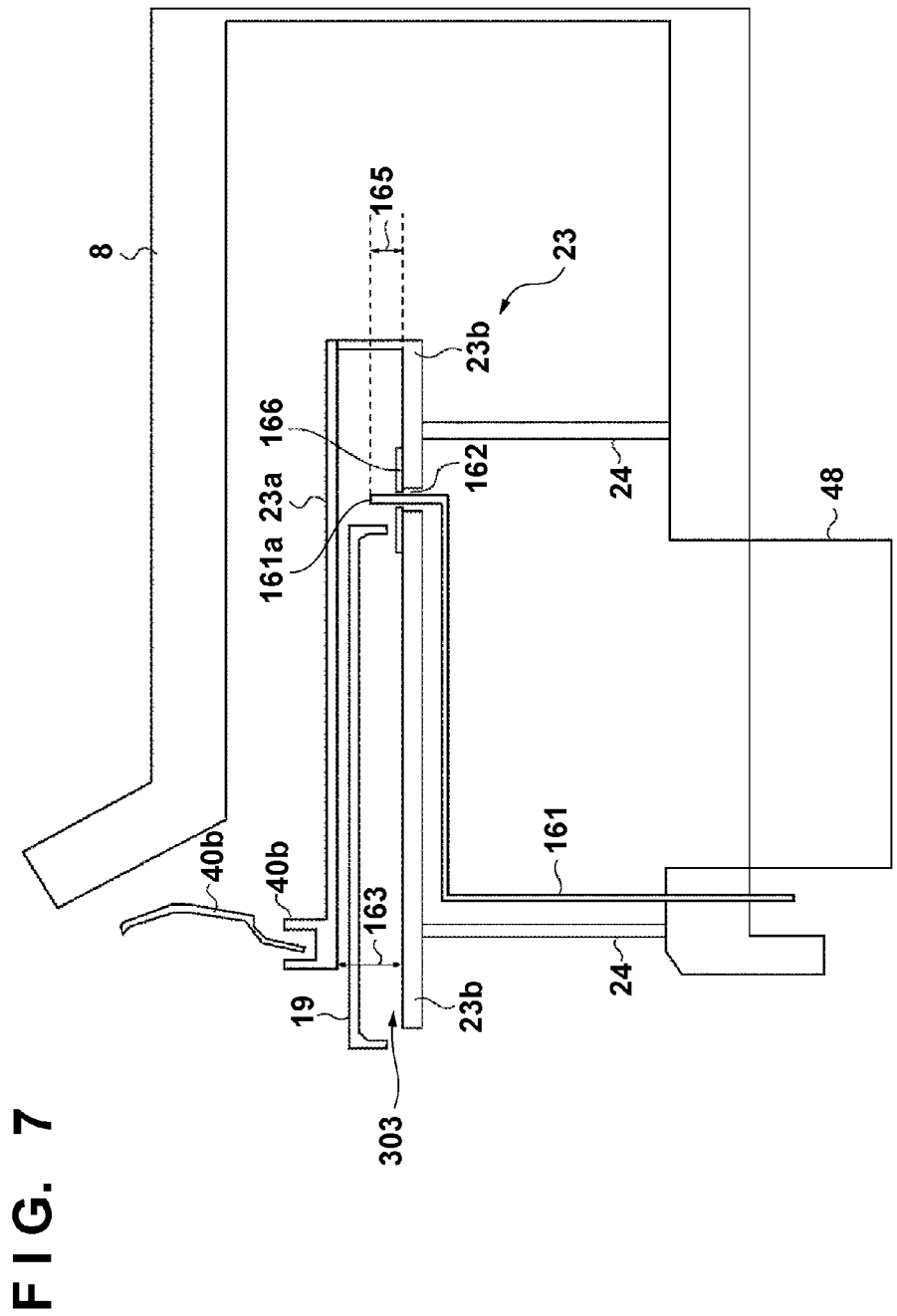
FIG. 7 is an enlarged view for explaining an arrangement which introduces a reactive gas into the sputtering space in the embodiment.

A shutter accommodation container 23 which accommodates a substrate shutter 19 when the substrate shutter 19 is retracted from the vacuum chamber 2 can be provided inside the exhaust chamber 8. Also, a reactive gas introduction pipe 161 for introducing a reactive gas into the sputtering space can be provided in the shutter accommodation container 23, as illustrated in FIG. 7. The reactive gas introduction pipe 161 can be fixed to the exhaust chamber 8.

A chimney 9 to serve as a cylindrical shield can be mounted in the space between the target holder 6 and the cathode shutter 14 so as to surround the target holder 6. A magnetron discharge space MDS facing the sputter surface of the target 4 mounted on the target holder 6 is surrounded by the chimney 9. The magnetron discharge space MDS communicates with the vacuum chamber 2 while the cathode shutter 14 is open. A gas introduction path 34 is provided inside the cylindrical chimney 9 having an appropriate thickness. The gas introduction path 34 is connected to a first inert gas supply source 52 via a first inert gas supply device 51. As shown in FIG. 1, by introducing an inert gas into the magnetron discharge space MDS using the first inert gas supply device 51 while the cathode shutter 14 is closed, the plasma density in the vicinity of the target 4 can be maintained high to easily ignite the plasma. Also, a gas introduction path 35 is provided between the cathode shutter 14 and the ceiling wall (inner wall) of the vacuum chamber 2, and connected to a second inert gas supply source 54 via a second inert gas supply device 53.

The inner surface of the vacuum chamber 2 is grounded. A deposition shield plate 40 can include cylindrical deposition shield plates (shields) 40a, 40b, and 22 and a ceiling deposition shield plate (shield) 40c. The cylindrical deposition shield plates 40a and 40b can be disposed inside the vacuum chamber 2 between the target holder 6 and the substrate holder 7, and grounded. The ceiling deposition shield plate 40c is disposed inside the vacuum chamber 2 to face the substrate holder 7, and has an opening OP through which the magnetron discharge space MDS and a process space for processing a substrate 10 communicate with each other. The ceiling deposition shield plate 40c defines the ceiling of the process space. The deposition shield plate 40a includes shields 40a1 and 40a2. The upper end portion (end portion) of the shield 40a1 can have a recessed portion such as a U-shaped portion. The lower end portion (end portion) of the deposition shield plate 40b can have a projecting portion such as an I-shaped portion. The projecting portion which can be provided at the lower end portion of the deposition shield plate 40b can be inserted into the recessed portion which can be provided at the upper end portion of the shield 40a1 in a noncontact state, thereby forming a so-called labyrinth-shaped exhaust path (gap) 401. The exhaust path (first exhaust path) 401 formed between the shield 40a1 and the deposition shield plate (shield) 40b can be formed as an annular gap at a position above an opening portion 303 provided in the deposition shield plate 40b (a position on the side of the target holder 6 with respect to the opening portion 303). An exhaust path (second exhaust path) 403 formed between the deposition shield plate (shield) 22 and the shield 40a2 of the deposition shield plate 40a can be formed as an annular gap at a position below the opening portion 303. As described above, the deposition shield plate 40 is formed by at least two members (shields), and a gap can be formed between these members.

In this specification, a deposition shield plate means a member which is formed separately from the vacuum chamber 2 to protect the inner surface of the vacuum chamber 2 by preventing sputter particles from adhering to the inner surface of the vacuum chamber 2, and can be periodically replaced. That is, in this specification, the shutter accommodation container (housing) 23 and a shielding member 40d (to be described later) fall into the category of the deposition shield plate.

In this manner, the sputtering apparatus 1 includes the first inert gas introduction path 34 and second inert gas introduction path 35. The first inert gas introduction path 34 is provided in the sputtering space, at least part of which is defined by the deposition shield plate 40, target 4, and substrate holder 7 arranged in the processing chamber 2, and introduces an inert gas into the processing chamber 2. The second inert gas introduction path 35 is provided outside the sputtering space, and introduces an inert gas into the processing chamber 2. The sputtering space is not completely sealed but communicates with a space, which falls outside the sputtering space of the space in the vacuum chamber 2, via a gap such as the gap 401 of the deposition shield plate 40. The interior of the shutter accommodation container 23 connected to the deposition shield plate 40 constitutes part of the sputtering space.

Magnets 13 for implementing magnetron sputtering are arranged on the back side of the target 4, that is, on the side, opposite to the sputter surface, of the target 4. The magnets 13 are held on a magnet holder 3, and can rotate by a magnet holder rotating mechanism (not shown). The magnets 13 rotate during discharge so as to uniform erosion of the target.

The target 4 is placed at a position (offset position) obliquely above the substrate 10. That is, the center point of the sputter surface of the target 4 shifts by a predetermined dimension with respect to a normal to the center point of the substrate 10. A power supply (voltage applying mechanism) 12 which applies sputter discharge power is connected to the target holder 6. Upon application of a voltage to the target holder 6 by the power supply 12, discharge starts, so sputter particles are deposited on the substrate 10. When the distance between the center point of the target 4 and the intersection point at which a normal to a plane including the upper surface of the substrate holder 7, which passes through this center point, intersects with this plane, is defined as a T/S distance, the T/S distance is 240 mm in this embodiment. Although the film forming apparatus 1 shown in FIG. 1 includes a DC power supply, the present invention is not limited to this. For example, the sputtering apparatus 1 may include an RF power supply. If an RF power supply is employed, a matching device must be placed between the power supply 12 and the target holder 6.

The target holder 6 is insulated from the vacuum chamber 2 at the ground potential by an insulator, and is made of a metal such as Cu. Hence, when the target holder 6 is applied with DC or RF power, it serves as an electrode. Note that the target holder 6 includes an internal water channel (not shown), and is configured to be able to be cooled by cooling water supplied from a water pipe (not shown). The target 4 contains a material component to be deposited on the substrate 10. Since the target 4 influences the purity of a film to be deposited, it desirably exhibits high purity.

The back plate 5 placed between the target 4 and the target holder 6 is made of a metal such as Cu, and holds the target 4.

The vacuum chamber 2 also includes the substrate holder 7 for mounting the substrate 10, a substrate shutter 19 provided between the substrate holder 7 and the target holder 6, and a substrate shutter driving mechanism 32 which opens/closes the substrate shutter 19. Note that the substrate shutter 19 is disposed near the substrate holder 7, and functions as a shielding member for setting a closed state in which the gap between the substrate holder 7 and the target holder 6 is shielded and an open state in which the gap between the substrate holder 7 and the target holder 6 is open.

A ring-shaped shielding member (to be referred to as a "cover ring 21" hereinafter) is provided on the surface of the substrate holder 7 on the outer edge (outer peripheral portion) of the mounting portion of the substrate 10. The cover ring 21 prevents sputter particles from adhering to portions other than the deposition surface of the substrate 10 mounted on the substrate holder 7. Note that portions other than the deposition surface can include the surface of the substrate holder 7, which is covered with the cover ring 21, and the side and lower surfaces of the substrate 10. The substrate holder 7 can be provided with a substrate holder driving mechanism 31 for lifting/lowering the substrate holder 7 and rotating it at a predetermined speed. The substrate holder driving mechanism 31 lifts/lowers the substrate holder 7 and fixes it at an appropriate position, thereby being able to adjust the distance (T/S distance) between the target 4 and the substrate 10.

Figure 2:
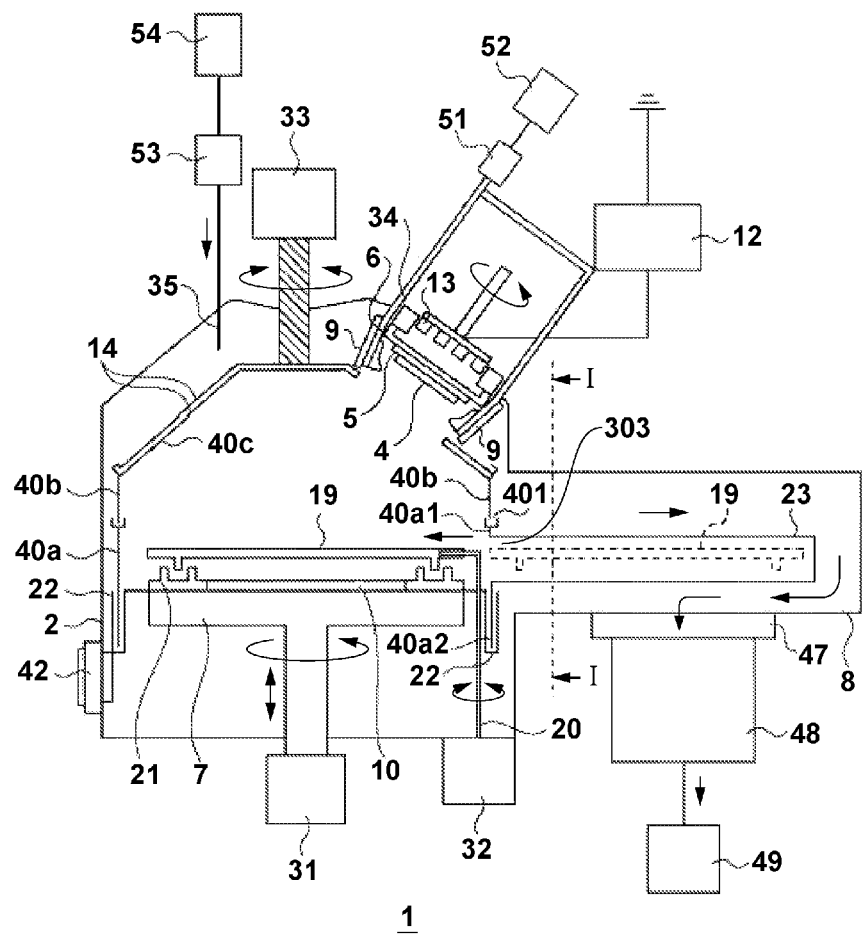
FIG. 2 is a schematic view of a reactive sputtering apparatus in another embodiment according to the present invention.

A sputtering apparatus 1 shown in FIG. 2 has basically the same arrangement as the sputtering apparatus 1 shown in FIG. 1. The same reference numerals as in FIG. 1 denote the same constituent members in FIG. 2, and a detailed description thereof will not be given. FIG. 2 shows the state in which the cathode shutter 14 is open.

Figure 3:
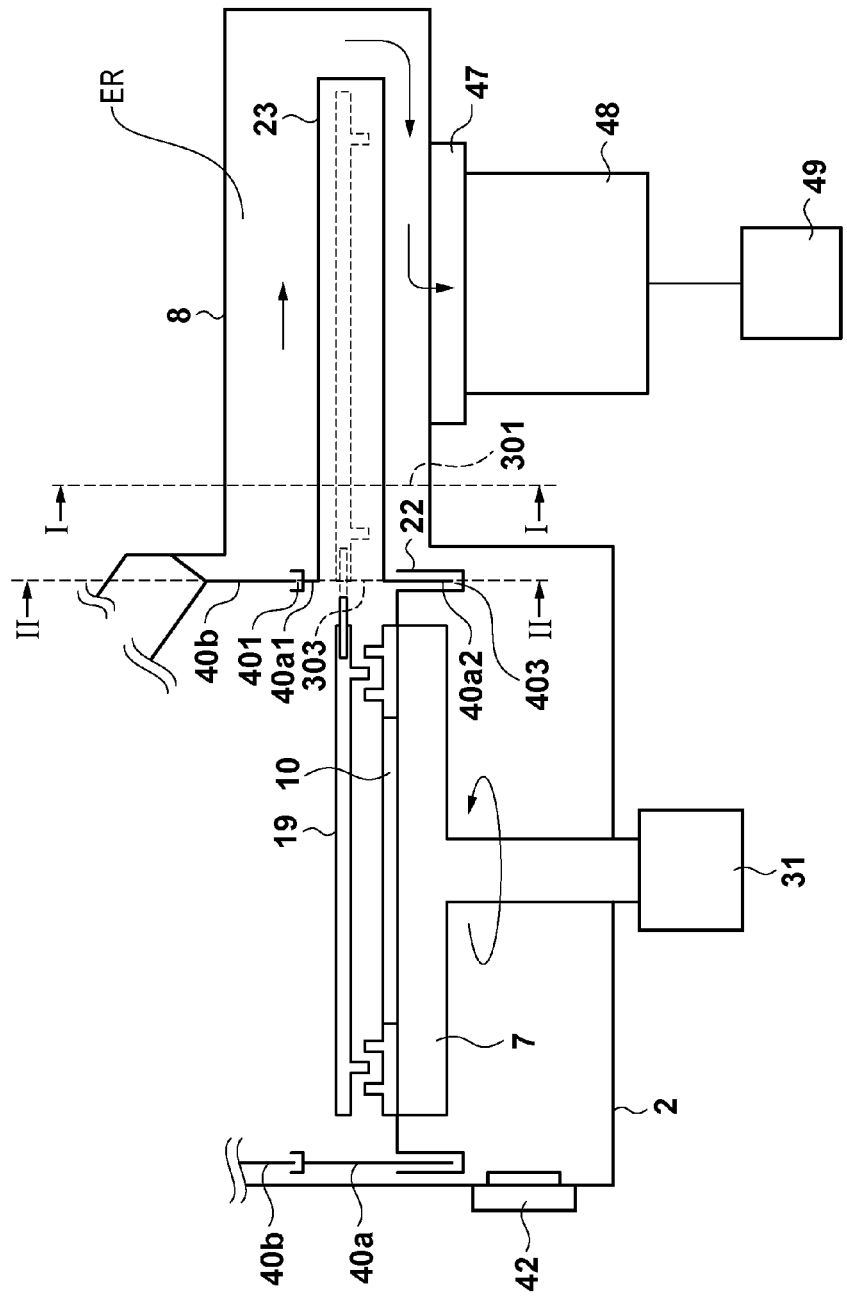
FIG. 3 is an enlarged view for explaining details of an exhaust chamber shown in FIG. 1.
Figure 4:
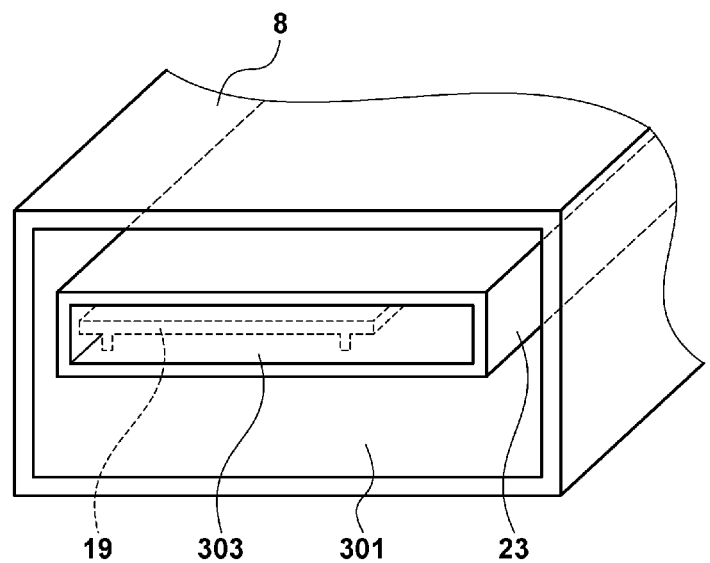
FIG. 4 is a sectional view taken along a line I-I in FIG. 3.
Figure 5:
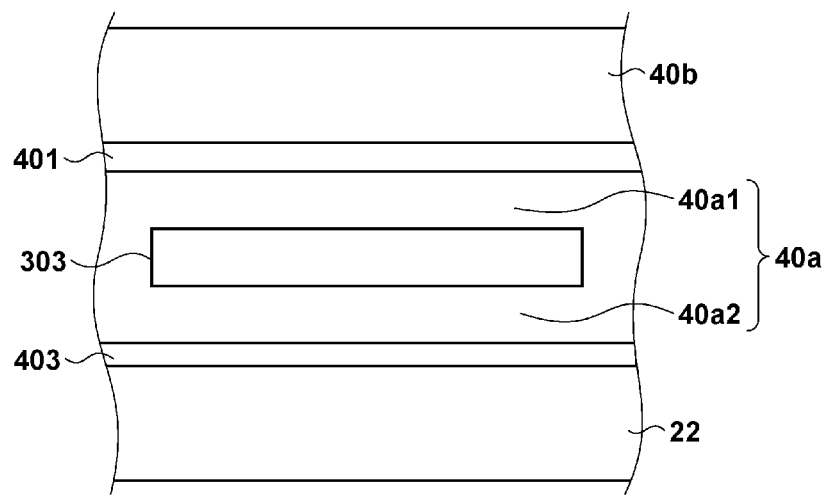
FIG. 5 is a sectional view taken along a line II-II in FIG. 3.

The arrangement of the shutter accommodation container will be described next with reference to FIGS. 3, 4, 5, 6A to 6E, and 7. FIG. 3 is an enlarged view for explaining details of the exhaust chamber 8. FIG. 4 is a sectional view taken along a line I-I in FIG. 3. FIG. 5 is a sectional view taken along a line II-II in FIG. 3. FIG. 7 is an enlarged view for explaining an arrangement which introduces a reactive gas into the shutter accommodation container in this embodiment. The shutter accommodation container 23 which accommodates the substrate shutter 19 when the substrate shutter 19 is retracted from the vacuum chamber 2 is provided in the exhaust chamber 8, as shown in FIG. 3. The shutter accommodation container 23 includes the opening portion 303 for extending/retracting the substrate shutter 19, and a portion other than the opening portion 303 is tightly sealed.

The shutter accommodation container 23 is disposed in the exhaust chamber 8 such that an exhaust region ER is formed around the shutter accommodation container (housing) 23 to communicate with a turbo-molecular pump 48 via a main valve 47, as shown in FIG. 3.

FIGS. 4 and 5 are views illustrating the portion surrounding the opening portion 303 of the shutter accommodation container 23. The opening portion 303 of the shutter accommodation container 23 faces the above-mentioned sputtering space. The deposition shield plate 40a (the shields 40a1 and 40a2 to be also referred to as deposition shield plates 40a1 and 40a2 hereinafter) and the deposition shield plates 40b and 22 have cylindrical shapes and are arranged inside the vacuum chamber 2. The exhaust path (first exhaust path) 401 formed between the deposition shield plates 40a1 and 40b is formed as an annular gap at a position above the opening portion 303 (at a position on the side of the target holder 6 with respect to the opening portion 303). The exhaust path (second exhaust path) 403 formed between the deposition shield plates 40a2 and 22 is formed as an annular gap at a position below the opening portion 303.

The gap between the deposition shield plates in this embodiment will be described in detail herein. The gas in the sputtering space passes through the exhaust path 401 formed as a labyrinth-shaped gap, and is exhausted by the turbo-molecular pump 48 connected to the exhaust chamber 8. Letting Q be the flow rate of the gas which passes through the exhaust path 401, and δp be the difference in pressure between the two ends of the exhaust path 401, the flow rate Q is known to be proportional to the difference in pressure in the molecular flow region. Then, we have:

$$Q = C \cdot \delta p \tag{1}$$

where C is a proportionality constant called the conductance, which represents the ease of passage of the gas that passes through the exhaust path 401. In an example, the conductance of the exhaust path 401 is 250 liter/sec. As will be described later, the conductance of the exhaust path 403 can be changed, and is 149 to 549 liter/sec in an example.

The conductance can be obtained by measuring the pressures of the interior and exterior of the sputtering space while introducing a gas into the sputtering space and exhausting the gas by the exhaust device placed outside the sputtering space, and substituting the gas flow rate and the pressures of the interior and exterior of the sputtering space into equation (1).

Figure 6:
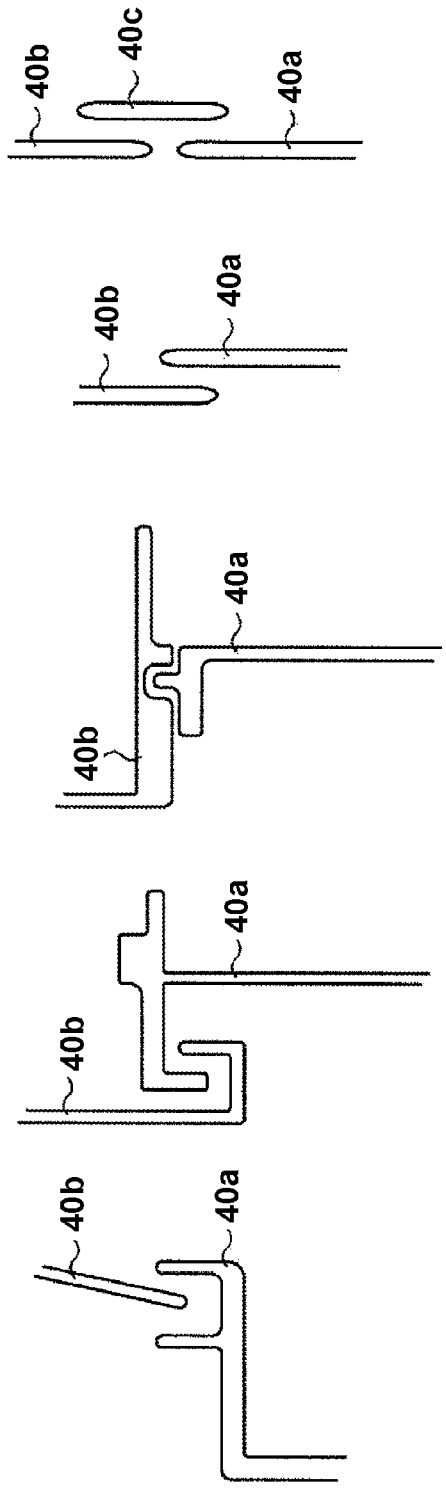
FIGS. 6A to 6E are views for explaining examples of deposition shield plates having a gap between them, which are applicable to the present invention.

FIGS. 6A to 6E are views for explaining examples of the gap provided in the deposition shield plates applicable to the present invention. As shown in FIGS. 6A, 6B, and 6C, a labyrinth-shaped gap is formed so that the projecting portion is inserted into the recessed portion in a noncontact state, thereby making it possible to reliably allow sputter particles generated in the sputtering space to adhere to the deposition shield plates, and prevent them from adhering to the inner wall of the vacuum chamber 2. Moreover, such a gap can diffuse argon gas introduced to the outside of the sputtering space into the sputtering space.

Also, as shown in FIGS. 6D and 6E, forming the gap as a narrow path makes it possible to produce the same effect as described above.

The deposition shield plate 40a has an opening at a position corresponding to the opening portion 303 of the shutter accommodation container 23, and functions as a first shield which partly covers an exhaust port 301. The deposition shield plate 40b is provided above the opening portion 303 of the shutter accommodation container 23, and functions as a second shield which partly covers the exhaust port 301. The deposition shield plate 22 is provided below the opening portion 303 of the shutter accommodation container 23, and functions as a third shield which partly covers the exhaust port 301. With movement of the substrate holder 7 by the substrate holder driving mechanism 31, the exhaust conductance of the exhaust path 403 can be changed.

As shown in FIG. 3 or 5, the deposition shield plate 40a1 is fixed around the opening portion 303 of the shutter accommodation container 23 so as to partly cover the exhaust port 301 of the exhaust chamber 8. The deposition shield plates 40a1 and 40b define the exhaust path 401.

The labyrinth-shaped exhaust path 401 also functions as a noncontact seal. A projecting portion such as an I-shaped portion of the deposition shield plate 40b is inserted into a recessed portion such as a U-shaped portion formed at the upper end portion (end portion) of the deposition shield plate 40a1 in a noncontact state, thereby a gap is formed between the recessed portion and the projecting portion. By arranging the recessed portion and the projecting portion to form a gap which constitutes a flow channel bent in a cross-section, sputter particles can be prevented from entering the exhaust port 301 of the shutter accommodation container 23. This makes it possible to prevent sputter particles sputtered from the target from passing through the exhaust path 401 and entering the exhaust chamber 8, and, in turn, to prevent them from adhering to the inner wall of the exhaust chamber 8.

Similarly, the deposition shield plate 40a2 is fixed around the opening portion 303 of the shutter accommodation container 23 so as to partly cover the exhaust port 301 of the exhaust chamber 8. The deposition shield plate 40a2 and the deposition shield plate 22 connected to the substrate holder 7 form the exhaust path 403. The deposition shield plate 22 has a recessed portion such as a U-shaped portion, and the exhaust path 403 is formed as a labyrinth-shaped exhaust path upon inserting a projecting portion such as an I-shaped portion of the deposition shield plate 40a2 into the recessed portion in a noncontact state. By arranging the recessed portion of the deposition shield plate 22 and the projecting portion of the deposition shield plate 40a2 to form a gap which constitutes a flow channel bent in a cross-section, sputter particles can be prevented from entering the exhaust port 301 of the shutter accommodation container 23. This makes it possible to prevent sputter particles sputtered from the target from passing through the exhaust path 403 and entering the exhaust chamber 8, and, in turn, to prevent them from adhering to the inner wall of the exhaust chamber 8.

The exhaust conductance is sufficiently higher in the exhaust path 401 than in the exhaust path 403 at the position to which the substrate holder 7 ascends, as shown in FIG. 1. That is, the gas flowing into the exhaust chamber 8 can more easily flow through the exhaust path 401 than through the exhaust path 403. When two exhaust conductances are connected in parallel, the composite conductance is their sum. Therefore, if one exhaust conductance is sufficiently higher than the other exhaust conductance, the lower exhaust conductance is negligible. In other words, the exhaust path 403 is not indispensable. In a structure such as the exhaust path 401 or 403, the exhaust conductance can be adjusted by, for example, the width of the gap of the exhaust path and the distance (length) by which the labyrinth-shaped portions of the exhaust path overlap each other.

For example, as shown in FIG. 3, the gaps of the exhaust paths 401 and 403 have nearly the same width, and the distance (length) by which the labyrinth-shaped portions of the exhaust path 401 overlap each other is shorter than that by which the labyrinth-shaped portions of the exhaust path 403 overlap each other, so the exhaust conductance is higher in the exhaust path 401 than in the exhaust path 403. Hence, gases introduced into the sputtering space (the space in which a plasma is present and which is surrounded by the deposition shield plates and the target) in the vacuum chamber 2 by the inert gas supply devices 51 and 53 and a reactive gas supply device 17 (see FIG. 8) are exhausted upon mainly passing through the exhaust path 401. Therefore, the exhaust conductance from the process space in the vacuum chamber 2 to the exhaust chamber 8 forms a structure that is not influenced by the opening/closing operation of the substrate shutter 19. Since the main exhaust path from the process space in the vacuum chamber 2 to the exhaust chamber 8 is provided at a position that is not influenced by shutter opening/closing, the exhaust conductance from the process space in the vacuum chamber 2 to the exhaust chamber 8 remains the same even upon opening/closing the substrate shutter 19. This makes it possible to stabilize the pressure of the gas in the process space in the vacuum chamber 2, which influences plasma generation, upon opening/closing the substrate shutter 19. This, in turn, makes it possible to suppress a change in exhaust conductance from the process space in the vacuum chamber 2 to the exhaust chamber 8 to stabilize the pressure in the vacuum chamber 2, thus depositing a high-quality film.

FIG. 7 is an enlarged view for explaining an arrangement which introduces a reactive gas into the shutter accommodation container 23 according to this embodiment. The shutter accommodation container 23 includes a cover plate 23a and frame body 23b from the viewpoint of ease of replacement and cleaning, as shown in FIG. 7. The reactive gas introduction pipe 161 is fixed to the exhaust chamber 8 so as to introduce a reactive gas (for example, nitrogen) from the outside of the exhaust chamber 8 into the vacuum chamber 2. Also, the reactive gas introduction pipe 161 is inserted into a gas introduction opening portion 162 provided in the frame body 23b of the shutter accommodation container 23 so that it reaches the interior of the shutter accommodation container (housing) 23. Note that the gas introduction opening portion 162 has a circular shape and a diameter larger than the reactive gas introduction pipe 161. In other words, the reactive gas introduction pipe 161 and the edge of the opening portion 162 in the shutter accommodation container 23 are spaced apart from each other. Thus, the shutter accommodation container 23 can be replaced without coming into contact with the fixed reactive gas introduction pipe 161.

In an example, the diameter of the reactive gas introduction pipe 161 is about 6.35 mm, the diameter of the gas introduction opening portion 162 is 7 mm, and the length 165 of the gas pipe protruding into the shutter accommodation container 23 is 15 mm. The height 163 of the opening portion 162 in the shutter accommodation container 23 is 33 mm, and the width of the opening portion 162 is 450 mm (not shown). The gap formed by the difference in diameter between the reactive gas introduction pipe 161 and the opening portion 162 has a width of about 0.5 mm, which is sufficiently smaller than the height 163 of the shutter accommodation container 23, that is, 33 mm. Since the gas flows through a flow channel which has a high conductance (which easily flows the gas), the conductance from the shutter accommodation container 23 to the process space is desirably sufficiently higher than that of the gap between the reactive gas introduction pipe 161 and the opening portion 162. This is done because the gas can reliably be introduced into the sputtering space even if a processing variation in shape of the opening portion 162 or a variation in mounting position of the shutter accommodation container 23 is present. The effect of stabilizing the deposition characteristics by reliably introducing the gas is conspicuous especially in the case of a reactive gas.

Also, as shown in FIG. 7, the position of the opening portion 162 of the shutter accommodation container 23 is desirably farther from the opening portion 303 of the shutter accommodation container 23 than the position at which the substrate shutter 19 is in a retracted state. Because it is hard for sputter particles to reach this position, this configuration can prevent sputter particles from sealing the gas blowing port of the reactive gas supply device 17 including the reactive gas introduction pipe 161 in a reactive gas introduction system, and sputter particles adhering on the reactive gas introduction pipe 161 from peeling off, scattering into the exhaust chamber 8, and then contaminating the substrate. This obviates the need to replace the reactive gas introduction pipe 161 or makes it possible to decrease the frequency of replacement of the reactive gas introduction pipe 161. On the other hand, sputter particles may adhere to the shutter accommodation container 23 albeit in a small amount, so the shutter accommodation container 23 may require replacement. The shutter accommodation container 23 functions as a shielding member which prevents sputter particles from the target 4 mounted on the target holder 6 from adhering to the introduction port of the reactive gas introduction pipe 161. A reactive gas supply device (gas cylinder) 18 for supplying a reactive gas is connected to the reactive gas introduction system.

Moreover, as shown in FIG. 7, a conductance adjusting member 166 which covers the gas introduction opening portion 162 and has an opening through which the reactive gas introduction pipe 161 runs may be detachably attached to the shutter accommodation container 23. In this case, desirably, the diameter of the gas introduction opening portion 162 is sufficiently larger than that of the reactive gas introduction pipe 161 and is, for example, 12 mm or more, and the diameter of the opening through which the gas pipe of the conductance adjusting member 166 runs is slightly larger than the outer diameter of the reactive gas introduction pipe 161 and is, for example, 7 mm. As a method of mounting the shutter accommodation container 23, first, the shutter accommodation container 23 is screwed into a column 24 while inserting the reactive gas introduction pipe 161 into the gas introduction opening portion 162 provided in the shutter accommodation container 23, and the conductance adjusting member 166 is placed to cover the reactive gas introduction pipe 161. Then, the cover plate 23a of the shutter accommodation container 23 is fixed to the upper portion of the frame body 23b of the shutter accommodation container 23 by, for example, screwing. With this procedure, it is possible to prevent the reactive gas introduction pipe 161 from coming into contact with the frame body 23b of the shutter accommodation container 23 and producing dust, and the shutter accommodation container 23 and reactive gas introduction pipe 161 from being damaged, when the shutter accommodation container 23 is mounted.

Figure 8:
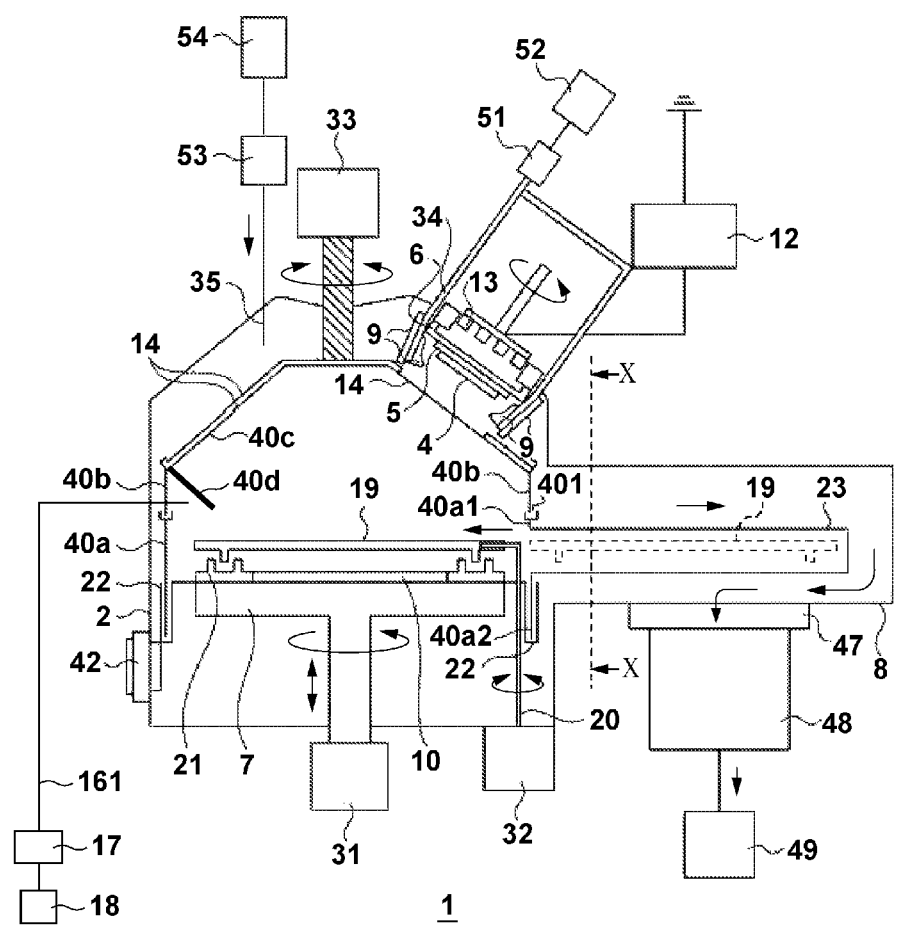
FIG. 8 is a view for explaining an arrangement which introduces a reactive gas into the sputtering space in the embodiment.

Although the reactive gas introduction pipe 161 is provided inside the shutter accommodation container 23 in the above-mentioned example, the present invention is not limited to this. For example, as shown in FIG. 8, an insertion port may be provided in the deposition shield plate 40b, the reactive gas introduction pipe 161 may be provided in this insertion port, and the shielding member 40d which shields the exhaust port of the reactive gas introduction pipe 161 may be provided between the target holder 6 and the introduction port of the reactive gas introduction pipe 161. A reactive sputtering apparatus having such an arrangement includes the reactive gas introduction pipe 161 which is fixed on the vacuum chamber 2 and introduces a reactive gas into the sputtering space, the replaceable deposition shield plate 40, and the shielding member 40d which is disposed between the target holder 6 and the reactive gas introduction pipe 161, and shields the introduction port of the reactive gas introduction pipe 161 so sputter particles do not adhere to this introduction port. In an example, the reactive gas introduction pipe 161 is a non-replacement part, and the deposition shield plate (including the shutter accommodation container 23 and shielding member 40d) is a replacement part.

Figure 9:
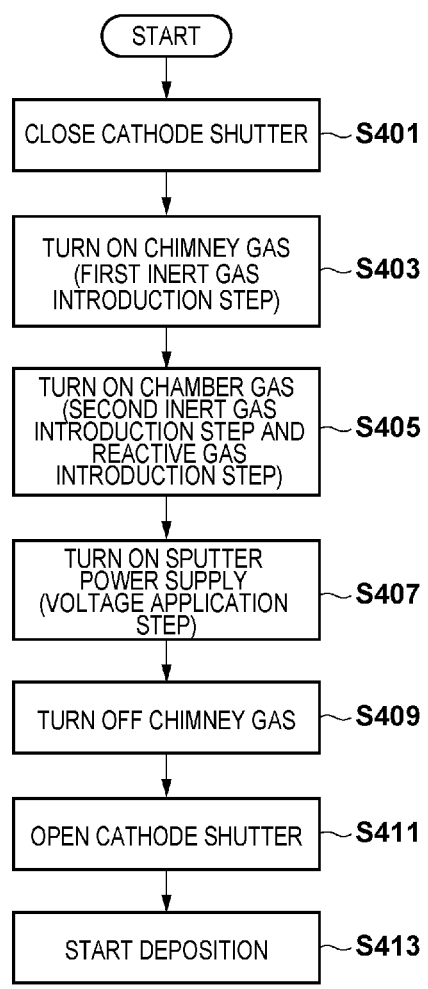
FIG. 9 is a flowchart showing a manufacturing method in the embodiment.

A method of manufacturing an electronic device using the sputtering apparatus 1 will be described with reference to FIG. 9. Note that the sputtering apparatus 1 undergoes, for example, sputter power supply ON/OFF control and gas introduction control by a control unit (not shown). In step S401, the control unit actuates the cathode shutter driving mechanism 33 to close the cathode shutter 14, as shown in FIG. 1. The control unit also actuates the substrate shutter driving mechanism 32 to close the substrate shutter 19.

In step S403 (first inert gas introduction step), the control unit introduces a process gas (for example, argon) from the first gas pipe 34 provided at the distal end of the chimney shield 9. The process gas fills the target space surrounded by the cathode shutter 14, target holder 6, and cylindrical deposition shield plate 40.

In step S405 (second inert gas introduction step and reactive gas introduction step), the control unit introduces, through the second gas pipe (second inert gas introduction port) 35, an inert gas (for example, argon) to the outside of the sputtering space defined by the deposition shield plate 40, target 4, and substrate holder 7 provided in the processing chamber 2. In other words, an inert gas is introduced into the space between the cathode shutter 14 and the inner wall (ceiling wall) of the processing chamber 2. Also, in this step, the control unit uses the reactive gas introduction pipe 161 to introduce a reactive gas into the sputtering space defined by the deposition shield plate 40, target 4, and substrate holder 7 provided in the processing chamber 2. In this manner, an inert gas is introduced into the space that falls outside the sputtering space, and a reactive gas is introduced into the sputtering space in order to stabilize the pressure in the sputtering space. In other words, by providing the space that falls outside the sputtering space with an exhaust unit and the gas introduction path 35 which introduces an inert gas, the inert gas introduced into the space that falls outside the sputtering space diffuses into the sputtering space, so the difference in pressure between the interior and exterior of the sputtering space can be reduced even if a mounting error of the deposition shield plate occurs.

Also, the reactive gas introduced into the sputtering space is consumed by a reaction with sputter particles in the sputtering space. Hence, the reactive gas only slightly flows out to the space that falls outside the sputtering space, and is therefore influenced little by a change in conductance.

In step S407 (voltage application step), the control unit actuates the sputter power supply to apply a voltage to the target holder 6. As shown in FIG. 1, while the cathode shutter 14 is closed, a voltage is applied to the target holder 6, thereby making it possible to start discharge while the pressure is high enough to easily ignite the plasma.

In step S409, the control unit stops process gas introduction from the first gas pipe 34. In step S411, the control unit actuates the cathode shutter driving mechanism 33 to open the cathode shutter 14, and then actuates the substrate shutter driving mechanism 32 to open the substrate shutter 19, thereby starting a deposition process in step S413.

Note that after a deposition process is performed a predetermined number of times, the deposition shield plate 40, for example, is periodically replaced. The deposition shield plate 40 having a film adhering on it is replaced with another new deposition plate in some cases, or reused after cleaning in other cases.

In this manner, during the deposition process, an inert gas is introduced from the space that falls outside the sputtering space into the sputtering space. The introduced inert gas diffuses to the entire chamber including the sputtering space due to a diffusion phenomenon so that the pressures in all the spaces in the chamber become uniform. This means that the pressure in the sputtering space can be stabilized even if the size of a gap 60, that is, the conductance of the gap 60 changes upon periodical replacement such as replacement of the deposition shield plate. Note that even if an inert gas is directly introduced into the sputtering space, it is not consumed in the sputtering space. Hence, the inert gas flows out to the outside of the sputtering space through the gap between the deposition shield plates, and is therefore exhausted by the exhaust unit. Then, the gap between the deposition shield plates, that is, the conductance changes upon replacement of the deposition shield plate, and the pressure in the sputtering space, in turn, changes. Therefore, the latter introduction is inappropriate.

On the other hand, when a reactive gas is introduced into the sputtering space, it is consumed by a chemical reaction with sputter particles in the sputtering space, and therefore is influenced by neither a mounting error of the deposition shield plate nor a change in conductance. Note that if a reactive gas is indirectly introduced from the outside of the sputtering space, it flows into the sputtering space through the gap between the deposition shield plates, and is consumed (the same effect as in exhaust of the reactive gas) by a reaction with sputter particles, so the pressure in the sputtering space changes with a change in conductance of the gap. Therefore, the latter introduction is inappropriate.

Note that an electronic device to which the present invention is applicable is not particularly limited. Examples of an electronic device to which the present invention is applicable include a transistor, diode, IC (Integrated Circuit), display, wireless IC tag, photosensor, image sensor, gas sensor, pressure sensor, laser device, optical switching device, electroluminescent device, liquid crystal backlight, and liquid crystal display device.

Figure 10:
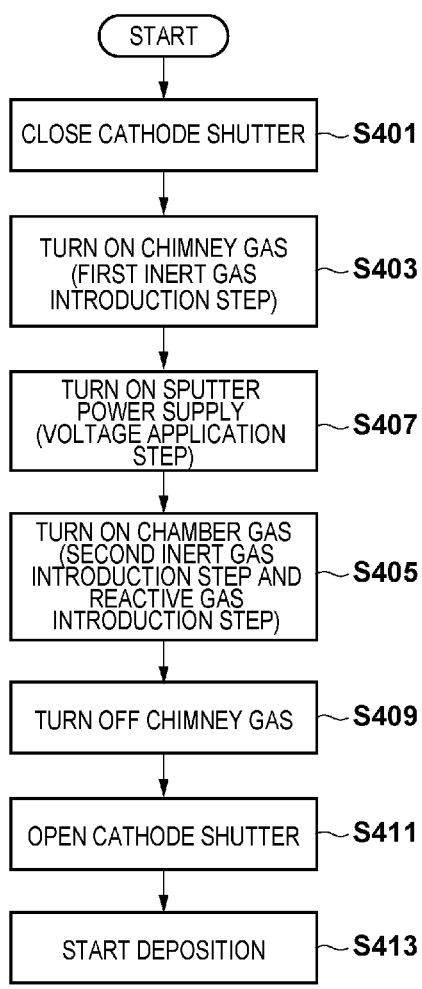
FIG. 10 is a flowchart illustrating a modification of the flowchart showing the manufacturing method in the embodiment.

FIG. 10 is a modification of the flowchart showing the manufacturing method according to the embodiment. This modification is different from the embodiment in that in the former steps S405 and S407 in the flowchart shown in FIG. 9 are interchanged. In this manner, when a voltage is applied to the target holder 6 in step S407 (voltage application step), and a process gas is then introduced to the outside of the sputtering space in step S405 (second gas introduction step), the pressure in the sputtering space can similarly be stabilized. Note that after a deposition process is performed a predetermined number of times, the deposition shield plate 40, for example, is periodically replaced. The deposition shield plate 40 having a film adhering on it is replaced with another new deposition plate in some cases, or reused after cleaning in other cases.

Figure 11:
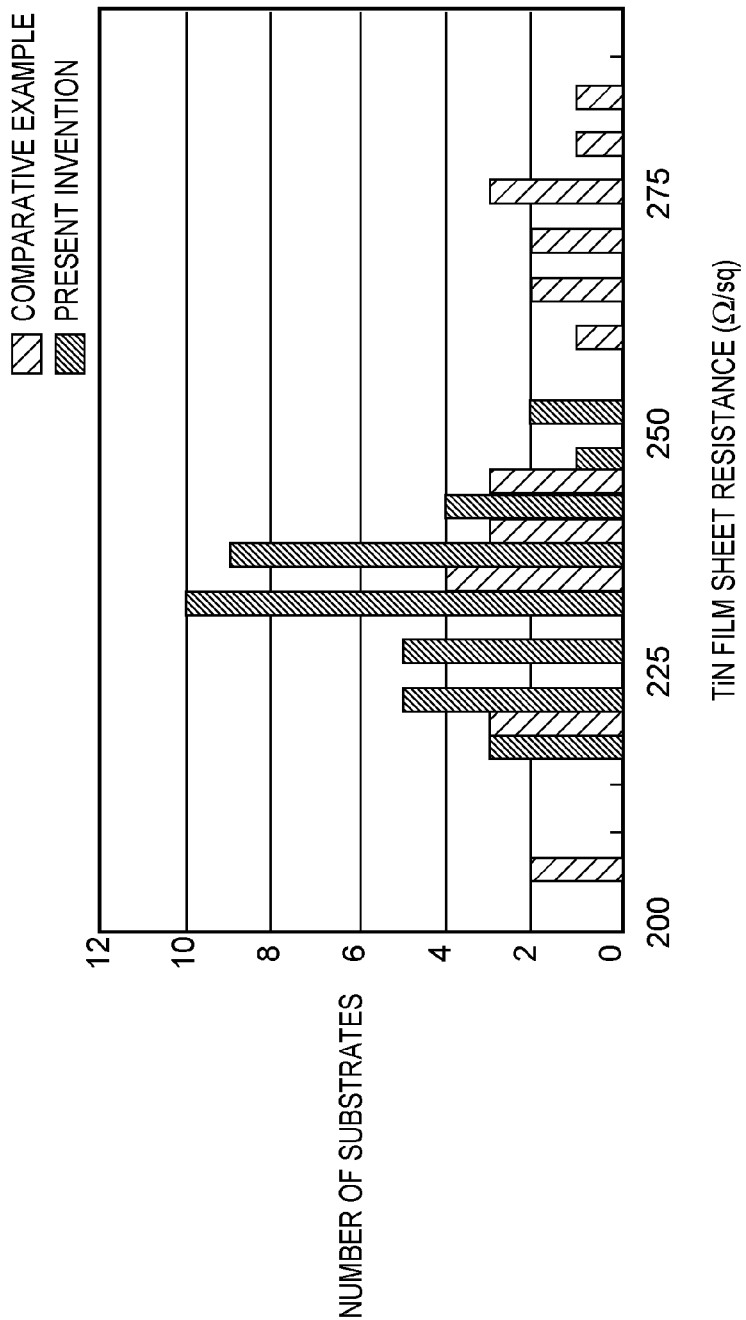
FIG. 11 is a graph for explaining a variation in sheet resistance of a device to be shipped, based on a comparison between the sputtering apparatus according to the embodiment of the present invention and that according to a Comparative Example.

FIG. 11 is a graph for explaining a variation in sheet resistance of a device to be shipped, based on a comparison between the sputtering apparatus according to the embodiment of the present invention and that according to a Comparative Example.

A TiN film was formed by using the sputtering apparatus according to the present invention to sputter a Ti target while indirectly introducing Ar gas from the outside of the sputtering space as an inert gas, and directly introducing nitrogen gas into the sputtering space as a reactive gas. In the Comparative Example, an inert gas and a reactive gas were introduced into the sputtering space.

As described above, the use of the sputtering apparatus according to the embodiment of the present invention made it possible to reduce the variation in sheet resistance of a manufactured product from ±16% to ±4.9%, compared to the sputtering apparatus according to the Comparative Example.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-284944, filed Dec. 21, 2010, which is hereby incorporated by reference herein in its entirety.

What is claimed is:

1. A reactive sputtering apparatus forming a film on a substrate by sputtering, the apparatus comprising:
a chamber; a substrate holder provided in the chamber to hold the substrate;
a target holder which is provided in the chamber and configured to hold a target;
a substrate shutter which is arranged between the substrate holder and the target holder when the substrate is shielded from the target;
a deposition shield having a first portion and a second portion connected to the first portion, where the first portion is provided in the chamber so as to form a sputtering space between the target holder and the substrate holder and prevents a sputter particle from adhering to an inner wall of the chamber, where the second portion has a shutter accommodation space therein to accommodate the substrate shutter when the substrate shutter is retracted from the sputtering space, and where the first portion and the second portion have an opening through which the sputtering space and the shutter accommodation space communicate with each other, the substrate shutter being retracted from the sputtering space into the shutter accommodation space through the opening;
a reactive gas introduction pipe having a reactive gas introduction port inserted in the shutter accommodation space, a reactive gas being blown from the reactive gas introduction port into the shutter accommodation space and being introduced into the sputtering space from the shutter accommodation space; and
an inert gas introduction pipe having an inert gas introduction port arranged in an outer space that falls outside the sputtering space and within the chamber, an inert gas being blown from the inert gas introduction port and being introduced into the sputtering space via the outer space.

2. The apparatus according to claim 1, wherein the deposition shield plate is replaceable, and the reactive gas introduction pipe is fixed on the chamber.

3. The apparatus according to claim 1, wherein the first portion includes at least two shields, a gap is formed between the at least two shields, and the gap has a labyrinth shape.

4. The apparatus according to claim 1, further comprising an exhaust chamber connected to the chamber, and an exhaust device configured to evacuate the chamber via the exhaust chamber, wherein the second portion is arranged in the exhaust chamber.

5. A reactive sputtering apparatus forming a film on a substrate by sputtering, the apparatus comprising:
a chamber;
a substrate holder provided in the chamber to hold the substrate;

a target holder which is provided in the chamber and configured to hold a target;

a substrate shutter which is arranged between the substrate holder and the target holder when the substrate is shielded from the target;

a deposition shield having a first portion and a second portion connected to the first portion, where the first portion is provided in the chamber so as to form a sputtering space between the target holder and the substrate holder and prevents a sputter particle from adhering to an inner wall of the chamber, where the second portion has a shutter accommodation space therein to accommodate the substrate shutter when the substrate shutter is retracted from the sputtering space, and where the first portion and the second portion have an opening through which the sputtering space and the shutter accommodation space communicate with each other, the substrate shutter being retracted from the sputtering space into the shutter accommodation space through the opening; and a reactive gas introduction pipe having a reactive gas introduction port inserted in the shutter accommodation space, a reactive gas being blown from the reactive gas introduction port into the shutter accommodation space and being introduced into the sputtering space from the shutter accommodation space.

* * * * *